United States Patent
Hirsch et al.

[11] Patent Number: 6,137,292
[45] Date of Patent: Oct. 24, 2000

[54] SELF-ADJUSTING BATTERY DIAGNOSTIC METHOD FOR CONTINUOUSLY PROVIDING BEST PREDICTION OF BATTERY RESERVE TIME

[75] Inventors: Marc Daniel Hirsch, Dallas; Mark Allen Johnson, Plano, both of Tex.; Robert John Kakalec, Madison, N.J.; Patrick Kwok-Yeung Ng, Plano, Tex.

[73] Assignee: Lucent Technologies, Inc., Murray Hill, N.J.

[21] Appl. No.: 09/303,875

[22] Filed: May 3, 1999

[51] Int. Cl.[7] .............................. G01N 27/416; H02J 7/00; G01R 31/36

[52] U.S. Cl. .......................... 324/427; 320/132; 320/483; 702/63

[58] Field of Search .................................... 324/427, 432; 320/132, 133; 364/483; 702/63

[56] References Cited

U.S. PATENT DOCUMENTS

| | | | |
|---|---|---|---|
| 4,876,513 | 10/1989 | Brikmyer et al. | 324/427 |
| 4,952,862 | 8/1990 | Biagetti et al. | 320/132 |
| 5,371,682 | 12/1994 | Levine et al. | 364/483 |
| 5,631,540 | 5/1997 | Nguygen | 320/127 |
| 5,656,919 | 8/1997 | Proctor et al. | 320/153 |
| 5,808,445 | 9/1998 | Aylor et al. | 320/132 |
| 5,847,566 | 12/1998 | Marritt et al. | 324/427 |
| 5,936,383 | 8/1999 | Ng et al. | 320/132 |
| 5,963,010 | 10/1999 | Hayashi et al. | 320/106 |
| 5,977,750 | 11/1999 | Ng et al. | 320/132 |
| 6,025,695 | 2/2000 | Friel et al. | 320/106 |

*Primary Examiner*—Peter S. Wong
*Assistant Examiner*—Gregory J. Toatley, Jr.
*Attorney, Agent, or Firm*—Locke Liddell & Sapp LLP

[57] ABSTRACT

A battery diagnostic method for monitoring the status of a battery in an electrical system and continuously providing a relatively accurate prediction of battery condition and performance, more particularly, a self-adjusting method for providing the best possible prediction of a battery's reserve time before, during, and after a battery discharge. The method of the present invention utilizes different prediction methods depending on what state the electrical system is in; that is, before, during or after a battery discharge. By determining what state the system is in, the most effective prediction method can be utilized to provide an accurate battery reserve time. By providing a relatively accurate continuous reserve time prediction, the method helps prevent a complete loss of power in an electrical system relying on a battery to supply the system's electrical power.

1 Claim, 3 Drawing Sheets

SELF-ADJUSTING BATTERY DIAGNOSTIC METHOD FOR CONTINUOUSLY PROVIDING BEST PREDICTION OF BATTERY RESERVE TIME

FIELD OF THE INVENTION

The present invention relates to a battery diagnostic method for monitoring the status of a battery in an electrical system and continuously providing a relatively accurate prediction of battery condition and performance. More particularly, it is concerned with a self-adjusting method for providing the best possible prediction of a battery's reserve time before, after, and during a battery discharge.

BACKGROUND OF THE INVENTION

As electrical devices and systems have become increasingly prevalent in consumer and industrial applications, there has been a corresponding increase in the use of batteries. The uses of batteries to supply electrical power are as varied as the electrical devices or systems in which they are used. Some electrical systems, such as portable electronic devices, use batteries as their primary source of electrical energy. Other electrical systems or devices receive their primary supply of electrical power from a power source such as a generator, power plant, or line power supply. Even these devices often utilize a battery, however, as a back-up or secondary supply of electrical power. The method of the present invention is intended for use in electrical systems using a battery as a back-up or secondary power supply (herein "battery-backed" systems). In such battery-backed systems, if the primary power source fails, the battery can be used to supply electrical power until the primary power supply is reinstated. This scheme of redundant power sources is often utilized in electrical devices or systems in which a temporary loss of power is problematic. Such systems include very complex as well as relatively simple applications. Examples include: alarm clocks, where a loss of power could result in the clock losing track of the proper time thus resulting in a false or a late alarm; computers, where an untimely loss of power could result in lost data; and telecommunications systems, where a loss of power could result in a shutdown of communications networks.

Regardless of the electrical system in which it is used, a battery is simply a device used to store electrical energy. As used herein, the term battery will include both a singular device used to store electrical energy as well as multiple storage devices connected in an array or other configuration to provide additive storage capacity. The process of storing electrical energy or power into a battery is referred to as charging or recharging the battery. Conversely, the process of removing or using the stored electrical energy from a battery is referred to as discharging the battery. The amount of electrical energy stored in a battery is typically referred to as a battery's capacity (Q) and is measured in units of ampere-hours (AH). The unit ampere-hours is indicative of the relationship between a battery's remaining capacity (Q), reserve time (t), and the current (I) being supplied by the battery. Specifically, the relationship corresponds to the following equation:

$$t = \frac{Q}{I}.$$

As indicated by this equation, there is an inverse relationship between reserve time (t) and current (I). That is, the greater the current being supplied by the battery, the faster the battery discharges its stored capacity of electrical energy, and thus, the shorter the time the battery can supply such current before completely discharging its total capacity. Conversely, the smaller the current supplied, the slower the battery discharges, and the longer the battery can supply such current before becoming completely discharged.

The total amount of energy that can be stored in a battery, i.e. a battery's total capacity, depends on the type, size, and condition of the battery. Since a battery can only store a limited amount of electrical energy, once that energy has been exhausted the battery will no longer be able to supply electrical power to the electrical system or device. Obviously then, for any electrical system incorporating a battery, knowing how much battery capacity remains is a convenient feature since a battery's remaining capacity determines the battery's reserve time, i.e., how much longer before the battery supply is exhausted and thus how much longer the electrical device or system may be used. In electrical systems which require an uninterrupted power supply, determining when the battery power supply will be exhausted may not only be a convenient feature but such capability may be a critical system design feature. In order to ensure an uninterrupted power supply, the remaining battery capacity or reserve time needs to be accurately predicted such that either the primary power supply can be restored to service, or another alternative power supply can be connected, before the battery power supply is exhausted.

In many systems that utilize a battery, the system is specifically designed with the capability of monitoring the condition or health of the battery. Some systems incorporate a capacity indicator, or "fuel gauge," which shows the available battery capacity. Such a fuel gauge allows one to determine if the battery has sufficient capacity to support the system for a sufficient time before the primary power is reinstated. Moreover, such a fuel gauge can be useful during a battery discharge to determine how much battery capacity remains and thus how much reserve time the battery has left.

Various diagnostic methods and apparatus have been developed to monitor the condition of a battery and to provide an estimate or prediction of the battery's performance characteristics; i.e., remaining capacity (Q) and reserve time (t). Typically, these methods utilize some combination of predetermined battery parameters, which are indicative of the battery's expected or ideal performance, and measured battery parameters, which characterize the battery's actual performance during a battery discharge. Using these parameters, a prediction of the battery's remaining capacity (Q) and/or reserve time (t) can be provided with varying levels of accuracy.

A majority of the available methods and apparatus for predicting battery performance, however, only do so for a discharging battery. In fact, most battery diagnostic methods only contemplate monitoring the battery during a battery discharge and providing a prediction of battery condition and performance based on measurements of the battery's performance during the discharge. Herein, we will refer to these methods generally as "discharge diagnostic methods" because they predict battery reserve time or capacity based on measurements of battery performance during a battery discharge. The reason most battery diagnostic methods are "discharge diagnostic methods" is because a battery's capacity and reserve time can be much more accurately predicted using data from a battery discharge. The reason for this is simple: the battery is really only in use when it is discharging, that is, when it is providing the electrical power for the system. By measuring or monitoring the battery's performance while it is in use (i.e., during a discharge), the battery's actual condition can be determined. Without knowing the battery's actual condition, assumptions about the battery's condition would have to be made in order to predict the battery's future performance. Without a discharge, the battery is typically assumed to be performing as a new battery of the same type, ignoring the effects of aging, temperature, environment, etc. Whenever such assumptions are made the accuracy of any resulting predictions suffers.

Examples of available methods and apparatus for predicting battery performance include the following:

The initial diagnostic methods used for predicting remaining battery capacity or reserve time were strictly empirical, wherein extensive testing of the battery would be conducted in order to compile a large database of characteristics indicative of the battery's performance throughout the cycle of the battery from a fully charged state to a fully discharged state. By comparing these predetermined test characteristics to the battery's actual characteristics, as measured during use, one could predict what stage of discharge the battery was in and thus how much battery capacity or reserve time remained.

For these empirical methods to yield accurate and reliable results, however, the initial testing had to account for a multitude of factors which could affect the battery's performance. This means the testing had to be performed under conditions matching the actual use of the battery as closely as possible. Not only did this mean testing had to be performed for each type and size battery individually, but also the testing needed to include other external variables such as the load on the battery as well as the battery's temperature and environment (all factors which would affect the battery's performance characteristics). The result is that there were innumerable combinations of such factors which would have to be tested for each battery in order for the empirical data to be useful and accurate for all applications. Moreover, to have test data useful for reliably predicting a specific battery's performance essentially required duplicating the application in which the battery was going to be used. This was obviously impractical to do for all possible applications. Typically, then, the testing would be standardized by performing the tests with standard loads and standard variables for the surrounding temperature/environment for each of the different types and sizes of batteries. The data from these standardized tests, however, provided limited accuracy and reliability for predicting the remaining battery capacity and reserve time.

Other more theoretical-based diagnostic methods have been utilized to address the inherent limitations of attempting to rely strictly on such empirical methods for predicting the remaining capacity and reserve time of a battery. One such method of prediction is based on the Peukert equation:

$$t=aI^b$$

where (t) is the reserve time to a given end voltage, (I) is the discharge current and (a) and (b) are empirically determined parameters. The remaining reserve time during discharge is obtained by subtracting the actual time of discharge from the value (t) given by the equation. The only real time data used in this approach is the discharge current (I), while the parameters (a) and (b) are experimentally predetermined by extensive testing, data acquisition, and parametric analysis. Since these parameters are empirically derived, the values of these parameters are fixed and do not adapt to changing conditions affecting battery performance such as changing load requirements, temperature, or aging of the battery.

An attempt to provide more accurate predictions by being more responsive to changes in battery behavior during discharge is disclosed in the patent application Ser. No. 08/013,272, filed Feb. 4, 1993, submitted by D. Levine et al. now U.S. Pat. No. 5,371,682 which utilizes matrices of predetermined parameters that correlate the slope of the voltage versus discharge time at various discharge currents, battery voltages during discharge, and end voltages. The use of voltage-versus-time slopes for prediction allows the method to be highly adaptable to changes in battery behavior during discharge. This method, however, also requires extensive initial testing to derive the data to populate the matrices.

Another discharge diagnostic method is disclosed by R. Biagetti and A. Pesco in U.S. Pat. No. 4,952,862. This method operates by measuring the difference between battery voltage during discharge and the battery plateau voltage, $$V_{battery}-V_P.$$

During discharge this difference is plotted against a ratio of discharged capacity to the total discharge capacity available:

$$Q_{removed}/Q_{to-end-voltage}.$$

This plot, created from measured data, is a single curve having an exponential and a linear region. The curve can then be used to determine remaining capacity and reserve time from the measured discharged capacity ($Q_{removed}$) and the plateau voltage ($V_p$).

Another approach in determining the reserve time of a discharging battery, disclosed in U.S. Pat. No. 4,876,513, takes advantage of the fact that when battery voltages (corrected for internal resistance) are plotted versus a ratio of ampere-hours remaining to ampere-hours available to a certain discharge voltage, all discharge curves fall on a single curve. The battery voltages are calculated using a battery internal resistance that is measured periodically during discharge.

Although moderately effective, none of these preexisting methods for evaluating the state of a discharging battery works accurately at all temperatures, requires only a minimal number of empirically derived parameters, is independent of the battery size being monitored, and adapts to changing conditions affecting battery performance. In response to these deficiencies, Trung V. Nguyen developed a more accurate apparatus and method of predicting remaining battery capacity (Q) and reserve time (t) of a discharging battery to a selected end voltage. The method is disclosed in U.S. Pat. No. 5,631,540 and is primarily based on measurable battery parameters which do not require extensive pre-testing of the battery. The Trung method is the preferred discharge diagnostic method used for a portion of the inventive method of the present invention. Accordingly, the description of this method in U.S. Pat. No. 5,631,540 is incorporated herein in its entirety.

In the Trung method, the battery reserve time (t) of a discharging battery is determined by an arrangement considering the discharge current (I), battery voltage (V), battery temperature (T), and the battery's internal resistance ($R_{int}$). The remaining battery capacity (Q) is determined from the ratio between a maximum theoretical capacity ($Q_{max}$) and its present capacity (Q). A term defined by a sum of the battery full charge open circuit voltage ($E_{oc}$) and the voltage loss due to the internal resistance of the battery ($IR_{int}$) and the battery voltage on discharge (V) divided by the battery temperature (T), is computed as the temperature-corrected battery overvoltage ($\eta$):

$$\eta = \frac{Eoc - IRint - V}{T}.$$

The characteristics of the battery discharge are reduced to a ratio of the remaining battery capacity to maximum theoretical capacity:

$$\frac{Q}{Q_{max}}.$$

This normalized battery capacity value is plotted versus the temperature-corrected battery overvoltage to produce a discharge characteristic curve that is invariant to discharge rates, temperatures, and battery size. This normalized battery capacity is determined by fitting parameters to the overvoltage value η by the relation:

$$\frac{Q}{Qmax} = \text{EXP}(a + b\eta^c + d\eta^e).$$

to characterize the discharge characteristic and determine Q. A reserve time (t) can then be calculated from the determined capacity value (Q) using the relation:

$$t = \frac{Q}{I}.$$

The characteristic curve and the dynamic variables can be stored in a computer and processed continuously to provide a continuing real time prediction of the remaining capacity (Q) and reserve time (t) of the battery on discharge.

Ultimately, however, it should be understood that all discharge diagnostic methods, which rely on a battery discharge to provide estimates or predictions of battery status, are inherently deficient. If no battery discharge occurs or if no discharge has occurred in some time, discharge diagnostic methods may be unable to provide an accurate prediction or even any prediction at all. Moreover, any prediction available may be stale (i.e., based on old data) and therefore inaccurate and unreliable. Because a battery's performance changes over time, ideally the battery should be monitored on an ongoing basis. For discharge diagnostic methods, which require a battery discharge, this means battery discharges must occur in frequent intervals in order to accurately monitor the condition of the battery over time. In addition to a frequency requirement, the battery discharges must be of a certain duration in order to provide enough time to collect sufficient data on the battery's performance to perform the necessary battery diagnostics. In practice, however, normal battery discharges in a system may be infrequent and/or of insufficient duration to adequately monitor the condition of the battery. In fact, battery-backed systems, which operate from a primary power source and use a battery for back-up power, may not use the battery for days, months, or even years. In such systems, by the time a sufficient battery discharge occurs to test the battery, the battery may already be defective or inadequate. Accordingly, the ability to continuously provide a relatively accurate estimate of battery condition and prediction of battery performance, before, during, and after a battery discharge, is greatly desirable.

SUMMARY OF THE INVENTION

To this end, in accordance with the present invention, there is provided a self-adjusting method for monitoring the status of a battery before, during and after a battery discharge, and for providing a relatively accurate prediction of the battery reserve time throughout. The method of the present invention utilizes different prediction methods depending on what state the electrical system is in, that is, before, during or after a battery discharge. By determining what state the system is in, the most effective prediction method can be utilized to provide an accurate battery reserve time. By providing a continuous accurate reserve time prediction, the method helps prevent a complete loss of power in an electrical system which is relying on the battery for power. This is particularly important in battery-backed systems wherein a loss of power would be problematic.

The inventive method of monitoring the status of a battery, comprises the steps of: a) making an initial prediction of battery reserve time (t); b) adjusting the prediction of battery reserve time for changing load conditions in the electrical system until a battery discharge is sensed; c) adjusting the prediction of battery reserve time by summing capacity discharged from battery ($AH_{out}$) and capacity restored to battery ($AH_{in}$) until the end of Coup de Fouet portion of battery discharge is sensed; d) calculating battery reserve time using diagnostic discharge method until end of battery discharge and beginning of battery recharge is sensed; e) adjusting battery reserve time by summing capacity discharged from battery ($AH_{out}$) and capacity restored to battery ($AH_{in}$) until end of battery recharge is sensed; and f) repeating step b) through step f).

An alternate embodiment of the inventive method of monitoring the status of a battery, comprises the steps of: a) making an initial prediction of battery reserve time (t); b) adjusting the prediction of battery reserve time for changing load conditions in the electrical system; c) sensing a battery discharge; d) adjusting the prediction of battery reserve time by summing capacity discharged from battery ($AH_{out}$) and capacity restored to battery ($AH_{in}$); e) sensing the end of Coup de Fouet portion of battery discharge; f) calculating battery reserve time during remainder of battery discharge; g) sensing end of battery discharge and beginning of battery recharge; h) adjusting battery reserve time by summing capacity discharged from battery ($AH_{out}$) and capacity restored to battery ($AH_{in}$; i) sensing end of battery recharge; and j) repeating step b) through step j).

DETAILED DESCRIPTION OF THE DRAWINGS

Figure 1:
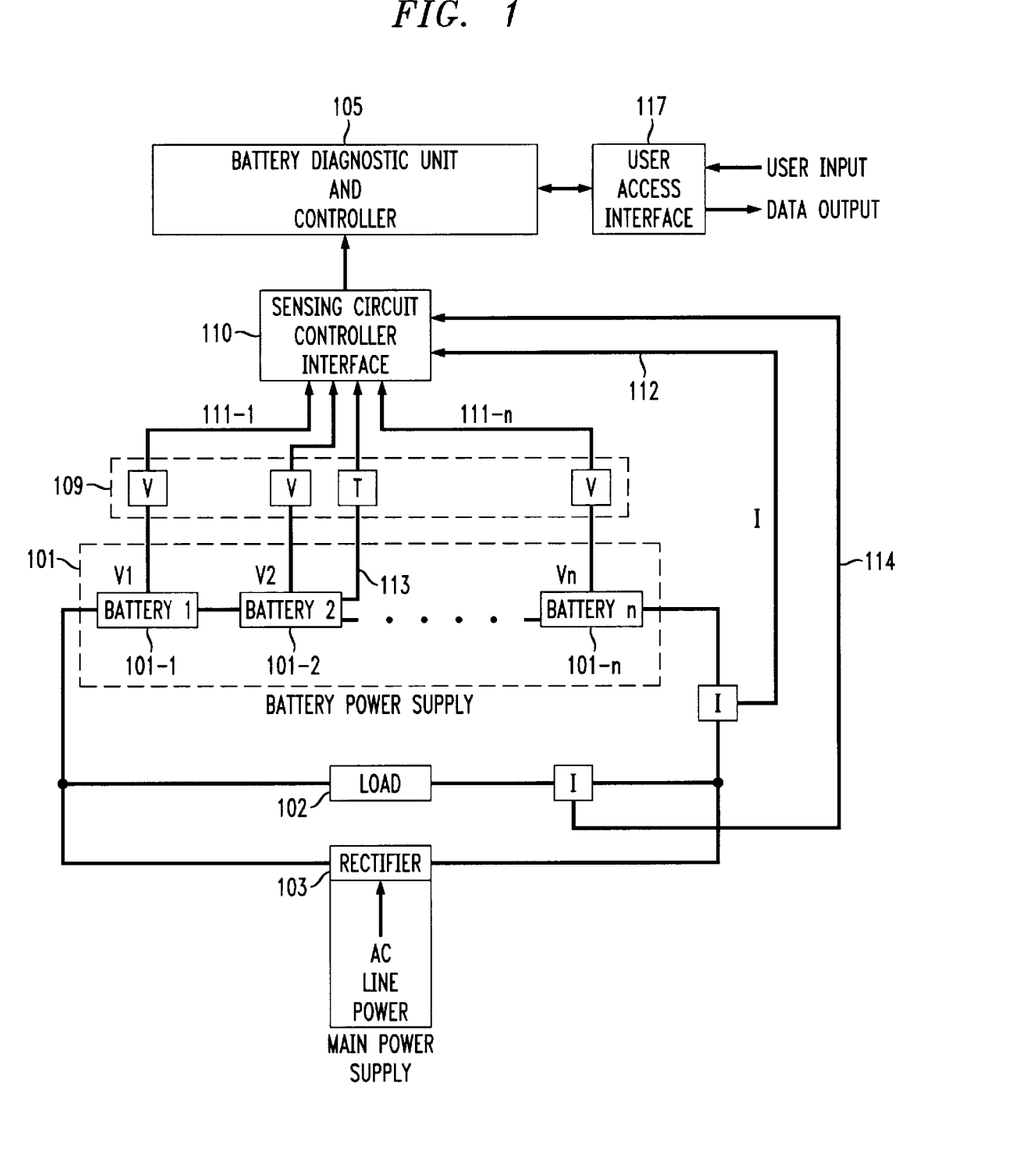
FIG. 1 is a block schematic of a battery backed electrical system in which the battery diagnostic method of the present invention could be incorporated.

FIG. 1 provides a block schematic of a battery backed electrical system in which the battery diagnostic method of the present invention could be incorporated. The system shown in FIG. 1 includes a main power supply 103 connected to primarily supply power to the system's load 102. The main power supply 103 typically comprises a rectifier circuit connected to an AC primary power line in order to provide rectified voltage to the load 102. Although a rectifier tied to an AC power line is shown in FIG. 1, other primary power supplies can be used such as generators, power plants, transformers, converters, and other power generating and power delivery devices.

A battery power supply 101 is connected to secondarily supply power to the load 102. More particularly, the battery power supply 101 is connected in parallel with the main power supply 103 and the load 102. With this configuration, if the main power supply 103 fails, or is otherwise interrupted, the battery power supply 101 will automatically begin to discharge in order to continue the supply of electrical power to the load 102. This configuration also allows the main power supply 103 to provide a rectified charging voltage to automatically and continuously recharge the battery power supply 101. This ensures that the battery power supply 101 will be fully charged and ready for use when and if the main power supply 103 fails. The battery power supply 101 shown in FIG. 1 comprises a plurality of storage devices or battery cells 101-1 to 101-n which are connected in series to provide the required voltage. Multiple such battery strings can be connected in parallel to provide additional storage capacity. The amount of battery capacity required is determined by (1) the amount of electrical energy necessary to continue supplying power to the load 102 if the main power supply 103 fails, and (2) the expected duration of any such failure. The greater the battery capacity, the longer the battery power supply 101 will be able to supply electrical energy to the load 102.

A battery diagnostic unit and controller 105 performs the battery diagnostics in order to determine the condition of the battery power supply 101. The battery diagnostic unit 105 is connected to a sensing circuitry-to-controller interface 110. The interface 110 is connected to sensing circuitry 109 including connections 111-1 to 111-n which can sense the total battery string voltage ($V_{batt}$) or the voltage of each battery cell ($V_1$-$V_n$), a connection 112 to sense the battery current ($I_{batt}$), a connection 113 to sense the temperature (T) of at least one battery cell, and a connection 114 to sense the load current ($I_{load}$). The controller/battery diagnostic unit 105 is also connected to a user access interface 117 for receiving user input and sending data output (such as data for a fuel gauge).

The battery monitoring unit 105 accepts measured data from the sensing circuitry interface 110 and predetermined data which may be either stored in memory or input from the user input/access device 117. The measured data from the interface 110 includes the real time battery voltage ($V_{batt}$), current ($I_{batt}$), and temperature (T), as well as the current in the load ($I_{load}$). Using the measured data, the controller 105 can determine the status of the electrical system, or state in which the electrical system is currently operating. In particular, the controller can determine whether the electrical system is floating (i.e., the system is in normal operation where the primary or main power supply is fully supplying the load and thus the system voltage is said to "float" at a normal voltage ($V_{float}$)); or whether the battery is discharging or recharging. The polarity of the battery current ($I_{batt}$) can be used to determine whether the battery is discharging or recharging. When the battery current ($I_{batt}$) is flowing into the battery, the battery is recharging. When the battery current ($I_{batt}$) is flowing out of the battery, the battery is discharging. Alternatively, when the battery voltage ($V_{batt}$) equals the float voltage ($V_{float}$) for the system, or when the battery current ($I_{batt}$) goes to zero, the system is floating in normal operation where the load is being fully supplied by the primary or main power supply 103.

Ultimately, based on the state in which the electrical system is determined to be operating, the controller 105 can perform the most effective, most accurate diagnostic method to provide an estimate of the battery condition and prediction of battery reserve time as more fully discussed below in the description of FIG. 2.

Figure 2:
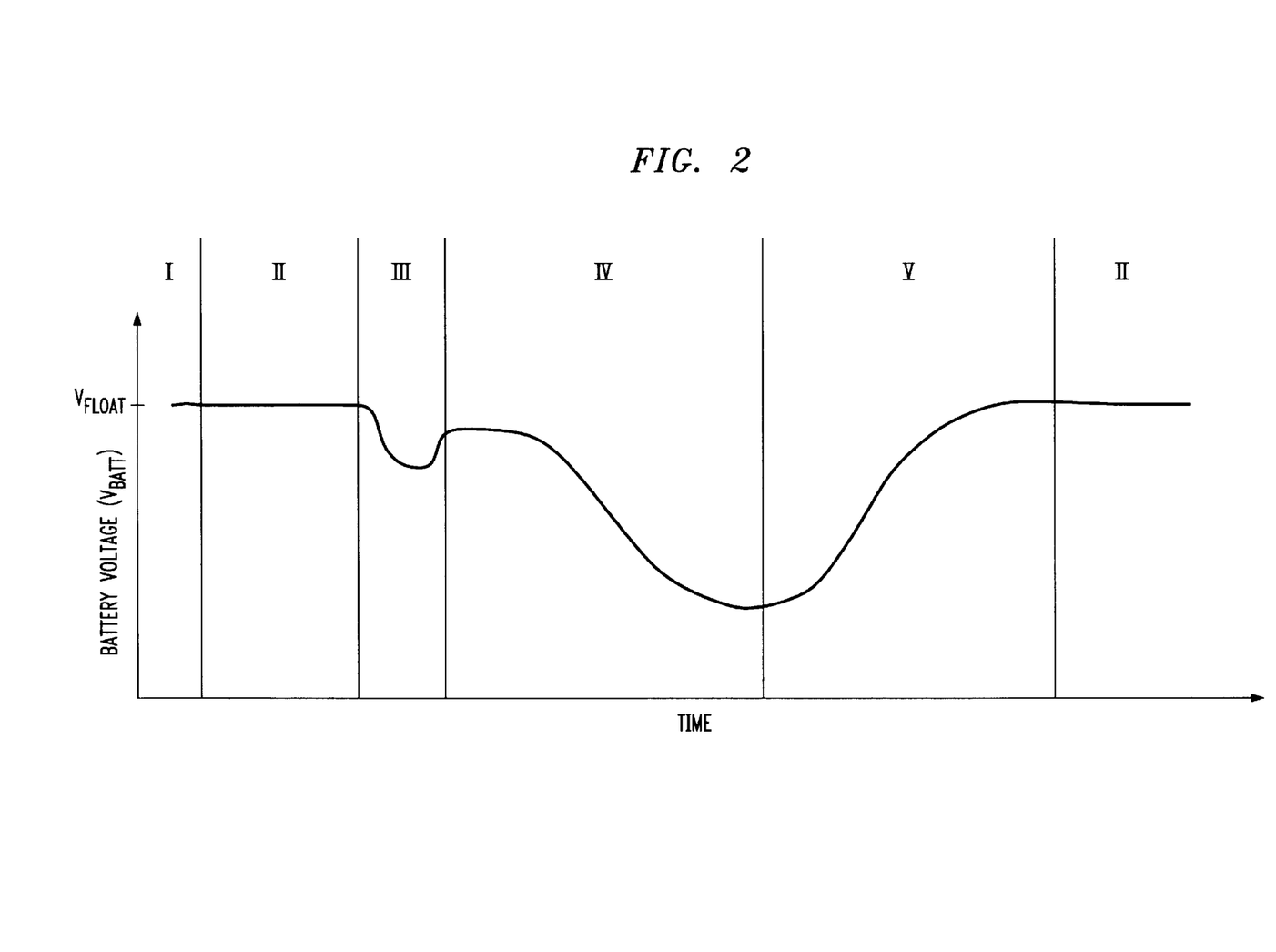
FIG. 2 is a graph of a typical voltage curve for an electrical system utilizing a battery to provide back-up electrical power, plotted in terms of battery voltage versus time, over a time period including a battery discharge.

FIG. 2 is a graph of the typical voltage curve for an electrical system utilizing a battery to provide back-up electrical power, plotted in terms of the battery voltage ($V_{batt}$) versus time, over a time period including a battery discharge. The curve is divided into five regions of time associated with differing characteristics of the voltage curve and differing states of the electrical system. The regions are denoted because each region requires a different technique to provide the best possible prediction of battery reserve time.

Region I or state I of FIG. 2 represents the origination point of the prediction process. At this point, the electrical system is in a normal operational state and power is being supplied from a primary power supply, such as line power from a utility. Since the battery is not supplying the system power, it is not discharging. Accordingly, the battery's actual condition or performance is not known and a prediction of battery reserve time must be made without using any discharge parameters or information. In the preferred method of the present invention, a variation of the Peukert equation is used to provide the best possible prediction of battery reserve time at origination. The equation used is:

$$t = c(I_{load})^{-n}$$

where (t) is the reserve time to the end voltage for the system ($V_{end}$). The end voltage ($V_{end}$) is the lowest voltage at which the system will continue to operate. ($I_{load}$) is the real-time system current as measured at the load. And, (c) and (n) are parameters derived from the following:

$$c = c_0 + c_1(V_{end}) + c_2(V_{end})^2 + c_3(V_{end})^3;$$

and $$n = n_0 + n_1(V_{end}) + n_2(V_{end})^2,$$

where $c_0$, $c_1$, $C_2$, $C_3$, $n_0$, $n_1$, and $n_2$ are empirically derived parameters for the battery, that is, parameters derived from empirical measurements, data acquisition, and testing of the particular battery type being used (often available from the battery manufacturer). Since these parameters are empirically derived, the values of these parameters are fixed and do not adapt to changing conditions affecting battery performance such as changing load requirements, temperature, or aging of the battery. Accordingly, the prediction obtained is not completely accurate. It is, however, the best prediction available given that there has been no battery discharge yet.

In Region II or state II of FIG. 2, the electrical system continues normal operation. Power continues to be supplied by the primary (non-battery) power supply and no battery discharge has occurred. The system voltage remains relatively stable. It should be noted, however, that the load requirements for the system may be changing; that is, the load may be requiring varying levels of current to maintain operation. Such changes in load requirements are not shown in the voltage curve since the primary power supply is completely supplying the load (even though the load has changing demands), thereby maintaining the voltage over the load, system, and battery. As previously noted, as the current increases, the rate of discharge of the battery will increase and the available reserve time will decrease. Accordingly, the amount of available battery reserve time will be greatly affected by the changing load requirements. In order to increase the accuracy of the reserve time prediction then, the changing load requirements should be taken into account. This is accomplished using the following formula (herein referred to as the "Float Equation"):

$$t = t_{best}(I_{old}/I_{now})^n$$

where ($t_{best}$) is the best reserve time prediction available to this point. Initially, ($t_{best}$) will equal the reserve time (t) calculated in Region I/state I. Once a new reserve time (t) has been calculated in Region II, this value should be stored in ($t_{best}$). In fact, in each region or state of the system, the best prediction variable ($t_{best}$) will be updated to reflect the best possible prediction of reserve time available at that time. Similarly, ($I_{old}$) is the battery current measured at the time the best reserve time ($t_{best}$) was found so this value must also be stored and updated along with ($t_{best}$). ($I_{now}$) is the present system current measured and (n) is the same battery parameter derived in Region I above. The Float Equation used in the Region II calculation adjusts the predicted battery reserve time (t) in response to changes in the load requirements thereby providing a more accurate and self-adjusting prediction of reserve time.

In Regions III and IV of FIG. 2, the battery voltage begins to decline indicating that the primary power supply has stopped supplying sufficient power, in whole or in part, to the system and as a result a battery discharge is occurring. As shown in the voltage curve, when the system begins drawing power from the battery, the battery voltage ($V_{batt}$) drops rapidly at the start of the battery discharge. After this initial drop, the battery voltage ($V_{batt}$) recovers and then begins to gradually decrease as the battery is further discharged and the battery capacity begins to diminish. The rapid initial drop in voltage is largely due to electrochemical phenomenon occurring within the battery as the battery begins to supply power. The minimum voltage reached in the initial drop is called the foothill voltage ($V_{fh}$). After the foothill voltage ($V_{fh}$) is reached, the battery voltage recovers to a higher voltage. The maximum recovery voltage reached after the initial drop in battery voltage is called the peak voltage ($V_{pk}$). This initial region of the discharge curve, from the start of the discharge to the peak voltage ($V_{pk}$), is called the Coup de Fouet and is shown in Region III of the graph. After the Coup de Fouet, the battery voltage ($V_{batt}$) begins to more gradually drop as the active materials for the electrochemical reactions in the battery, i.e., acid and lead oxide for lead acid batteries, are depleted in order to supply power to the system.

Although the Coup de Fouet is a typical discharge characteristic of certain types of batteries, such as lead acid batteries, the exact cause of the Coup de Fouet is not well known and its characteristics are not predictable. In fact, in extreme discharge conditions, such as very slow or very fast discharge rates, the Coup de Fouet may not be exhibited at all. Accordingly, this region creates great difficulty in predicting reserve time during this period of time.

In an attempt to provide the best possible prediction of battery reserve time, the following equation is used to update the predicted battery reserve time through this region:

$$t = t_{best}(I_{old}/I_{now\ normalized})^n - ((AH_{out} - AH_{in})/I_{now\ normalized})$$

Essentially, this equation is simply the equation used in Region II adjusted or updated by the total battery capacity lost by the battery throughout Region III. More specifically, the first part of the equation is similar to the calculation made in Region II where ($t_{best}$) ($I_{now}$) and (n) are the same as described in Region II, however, ($I_{now}$) has been normalized to ($I_{now\ normalized}$) using the following equation:

$$I_{now\ normalized} = (V_{now}/V_{float})I_{now}$$

where ($V_{now}$) is the voltage over the load, ($I_{now}$) is the current over the load, and ($V_{float}$) is the voltage at which the system normally floats.

This first portion of the equation provides a relatively accurate initial estimate of the reserve time, however, this estimate can be made more accurate by summing up the battery capacity lost during Region III, that is, Ampere-Hours-Out ($AH_{out}$) minus Ampere-Hours-In ($AH_{in}$):

$$AH_{out} - AH_{in}$$

where the Ampere-Hours-Out ($AH_{out}$) equals the summation of the current (in amperes) multiplied by the time (in hours) when the battery is discharging, as denoted by the equation:

$$AH_{out} = \Sigma(I_{now})\Delta T.$$

where the Ampere-Hours-In ($AH_{in}$) equals the summation of the current (in amperes) multiplied by the time (in hours) when the battery is recharging, as denoted by the equation:

$$AH_{in} = \Sigma(I_{now})\Delta T.$$

At any time, the polarity (positive or negative) of the current flowing in the battery can be used to determine whether the battery is being discharged or recharged. When the current is flowing from the battery to the system, the battery is discharging, and when the current is flowing into the battery from the system, the battery is recharging.

Note that the battery capacity is measured in ampere-hours (AH). Thus, by dividing the total capacity lost (in ampere-hours) by the normalized current (in amperes) as shown in the second portion of the Region III equation, we are left with a correction factor for the predicted battery reserve time (in hours). The equations used in Region III of the curve are referred to collectively as the "Summation Equations."

As soon as the Coup de Fouet ends, i.e., when the voltage recovers to the peak voltage ($V_{pk}$) the battery and system voltage ($V_{sys}$) begin a steady decline as the battery discharges, as shown in Region IV of FIG. 2. As previously discussed, the most accurate predictions of battery condition, capacity and reserve time can be made when the battery is actually in use, that is, when the battery is discharging. Accordingly, using any number of techniques to predict battery reserve time during a battery discharge, a very accurate best possible prediction of battery reserve time can be achieved. Examples of techniques used include the Trung and discharge diagnostic methods discussed above as well as additional algorithms as described U.S. patent application Ser. No. 09/062,961 entitled Battery Diagnostic Method and Apparatus now U.S. Pat. No. 5,977,750 and U.S. patent application Ser. No. 09/054,143 entitled Self-Correcting and Adjustable Method and Apparatus for Predicting the Remaining Capacity and Reserve Time of a Battery on Discharge now U.S. Pat. No. 5,936,383, both of which are incorporated by reference herein. Currently, the preferred embodiment of the inventive method used by the inventors utilizes the Trung method which accounts for variations in the environment and age of the battery. As more accurate methods are available, these methods can easily be incorporated into the method of the present invention. As in the other regions, since this is our new best prediction of battery reserve time, it is stored as the new best reserve time ($t_{best}$).

Region IV ends and Region V begins when the discharge is completed and the battery starts to recharge. This is shown on the voltage curve where the battery voltage ($V_{batt}$) stops declining and begins to climb back to the system float voltage ($V_{float}$). During the recharge, we can again provide a continuously updated best prediction of reserve time by keeping track of the total battery capacity being replenished into the batteries. In particular, the best reserve time can be updated using the same equations (that is, the Summation Equations) as used in Region III:

$$t = t_{best}(I_{old}/I_{now\ normalized})^n - ((AH_{out} - AH_{in})/I_{now\ normalized}).$$

$$AH_{out} = \Sigma(I_{now})\Delta T.$$

$$AH_{in} = \Sigma(I_{now})\Delta T.$$

Note that in Region V, however, the Ampere-Hours-In ($AH_{in}$) will be greater than the Ampere-Hours-Out ($AH_{out}$), whereas in Region III the opposite was true. This results in the reserve time being increased by the correction factor in Region V where it was decreased in Region III.

When the battery voltage returns to the system float voltage ($V_{float}$), the battery is essentially recharged and the system returns to state II or Region II. The system does not return to Region I because this is not the origination of the prediction process. Region I and the prediction therein are only the best possible prediction of reserve time when we have no previous data to assist the prediction. Accordingly, the same prediction process as described for Region II is again used with the best reserve time updated to reflect our latest best guess from Regions IV or V.

Finally, it should be noted that the process may not flow as neatly as described herein from one region or state to the next. For example, a momentary loss of primary power (i.e., a quick return of the primary power after a power outage) could cause the discharge to be interrupted in the Coup de Fouet region, Region III, before Region IV is ever achieved. Thus, the discharge curve would move from a Region III event, or state III, directly to the recharge region, Region V or state V. Similarly, another battery discharge could occur before the battery has had sufficient time to fully recharge. This could cause a jump from Region V to Region III without ever achieving the float state of Region II. Irrespective, each region can provide a best possible prediction of battery reserve time by keeping track of the latest updated best reserve time ($t_{best}$) and associated current ($I_{old}$) and using the present region's equation to alter that estimate as necessary. Thus, sporadic changes in states or regions should not affect the ability of the method of the present invention to provide a best possible prediction of battery reserve time before, during, and after a battery discharge.

Figure 3:
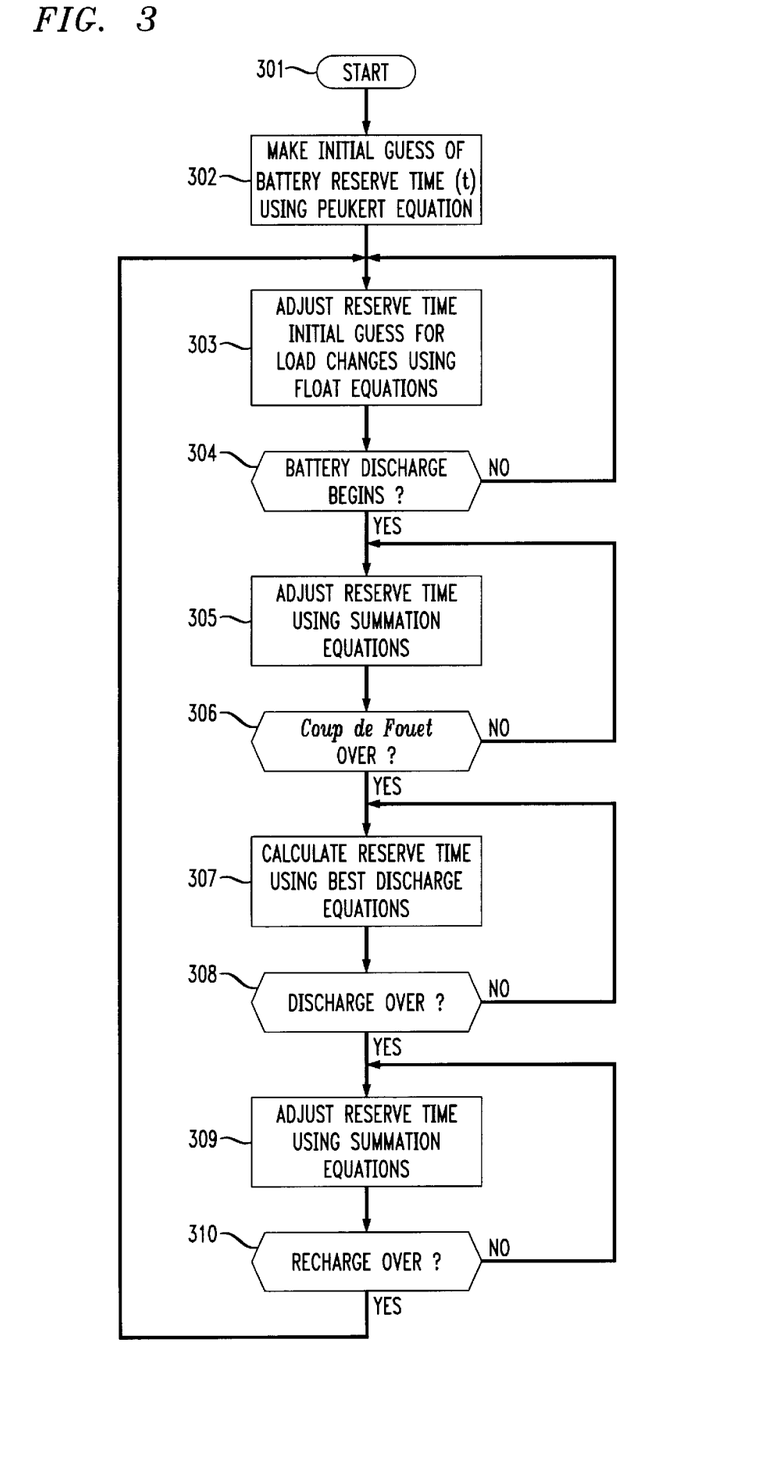
FIG. 3 is a flow diagram illustrating an embodiment of the battery diagnostic method of the present invention.

FIG. 3 provides a flow diagram illustrating an embodiment of the battery diagnostic method of the present invention. More particularly, FIG. 3 shows the process or method used in the preferred embodiment of the present invention which provides a best prediction of battery reserve time using varying equations depending on the state of the system. The inventive process starts at terminal 301 and proceeds to block 302 whose instructions require making an initial guess of the battery reserve time (t). This initial guess or estimate of the reserve time is performed using the Peukert equation. Since the initial guess is performed quickly and with little information about the actual system status, it is not completely accurate. It does, however, provide a good starting point for the reserve time estimate. As soon as the reserve time initial guess has been made, block 303 indicates that the reserve time can be adjusted to account for load changes, thereby keeping the reserve time estimate accurate even for changing system load conditions.

As discussed in the description of Region II of FIG. 2, these adjustments to the reserve time estimate are made using the Float Equation. Such adjustments continue to be made until a battery discharge begins, as shown in Block 304. A battery discharge can be sensed by monitoring the current in the battery ($I_{batt}$) and/or the voltage over the battery ($V_{batt}$). If the battery voltage ($V_{batt}$) drops below a predetermined threshold voltage for the system ($V_{thresh}$), then the battery voltage ($V_{batt}$) and system voltage ($V_{sys}$) are no longer being supported by the primary power supply, and a battery discharge has begun. Alternatively, if the polarity of the battery current ($I_{batt}$) indicates that current is flowing out of the battery, a battery discharge has begun. In the initial portion of the battery discharge, the battery voltage ($V_{batt}$) exhibits a Coup de Fouet, as discussed above in the description of Region III of FIG. 2. In a battery discharge, the voltage of the system ($V_{sys}$) and load ($V_{load}$) are being supported by, and thus are equal to, the battery voltage ($V_{batt}$). Accordingly, the system, load, and battery voltages will all exhibit the Coup de Fouet. By keeping track of the voltage during the Coup de Fouet, and comparing each new voltage measurement to the previous voltage measurements, the lowest or foothill voltage ($V_{fh}$) can be determined as well as the highest or peak voltage ($V_{pk}$). The Coup de Fouet ends once the peak voltage ($V_{pk}$) has been achieved and the battery begins a steady discharge. As indicated in block 305, during the Coup de Fouet the reserve time estimate is adjusted using the Summation Equations as discussed in the description of Region III of FIG. 2. Such adjustments continue to be made until the Coup de Fouet is over, as shown in block 306.

After the Coup de Fouet, the battery voltage ($V_{batt}$) begins a steady decline as the battery begins to steadily discharge. It is during this region that the most accurate predictions can be made of the battery condition and battery performance. Accordingly, block 307 directs that the reserve time be calculated using the Discharge Diagnostic Equations/Methods available, as discussed in the description of Region IV of FIG. 2. This highly accurate estimate of battery reserve time continues to be calculated until the battery discharge is over, as indicated in block 308. The end of the battery discharge can be sensed by monitoring the current in the battery ($I_{batt}$) and/or the system voltage ($V_{sys}$). If the polarity of the battery current ($I_{batt}$) indicates that current is flowing into the battery, the battery discharge has ended and a battery recharge has begun. Alternatively, if the system voltage ($V_{sys}$) returns to normal, then the voltage is being supported by the primary power supply, and the battery discharge has terminated.

As indicated in block 309, during the battery recharge the reserve time estimate is again adjusted using the Summation Equations as discussed above in the description of Region V of FIG. 2. Thus, the reserve time prediction/estimate is adjusted to account for the energy being restored to the battery during recharge, thereby maintaining the accuracy of the reserve time estimate even during a battery recharge. The reserve time estimate continues to be adjusted until the battery recharge ends, as indicated in block 310. By keeping track of the amount of capacity taken from the battery during discharge and comparing that to the amount of capacity restored to the battery during recharge, the completion of the battery recharge can be determined. That is, the battery recharge is complete when the capacity restored to the battery equals the capacity removed from the battery ($AH_{in} = Ah_{out}$). It should be noted that the recharge can end before completion if the recharge is interrupted by another battery discharge. Accordingly, the determination of whether the battery recharge is over, as directed by block 310, can be determined by either a change in the polarity of the battery current or when $AH_{in}=AH_{out}$. Once the battery recharge is over, the process continues at block 303, excluding the initial guess in Region I, block 302, which is only required when the method is first originated.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A method of monitoring the condition of a battery in an electrical system in order to provide a prediction of battery reserve time, comprising the steps of:

a) making an initial prediction of battery reserve time (t);

b) adjusting the prediction of battery reserve time for changing load conditions in the electrical system until a battery discharge is sensed;

c) adjusting the prediction of battery reserve time by summing capacity discharged from battery ($AH_{out}$) and capacity restored to battery ($AH_{in}$) until the end of Coup de Fouet portion of battery discharge is sensed;

d) calculating battery reserve time using diagnostic discharge method until end of battery discharge and beginning of battery recharge is sensed;

e) adjusting battery reserve time by summing capacity discharged from battery ($AH_{out}$) and capacity restored to battery ($AH_{in}$) until end of battery recharge is sensed; and f) repeating step b) through step f).

* * * * *